United States Patent
Florendo (10) Patent No.: US 11,882,661 B2
(45) Date of Patent: Jan. 23, 2024

(54) ELECTROMAGNET COILS MADE FROM FLEXIBLE CIRCUITS

(71) Applicant: KLA Corporation, Milpitas, CA (US)

(72) Inventor: Oscar G. Florendo, Hollister, CA (US)

(73) Assignee: KLA Corporation, Milpitas, CA (US)

(*) Notice: Subject to any disclaimer, the term of this patent is extended or adjusted under 35 U.S.C. 154(b) by 0 days.

(21) Appl. No.: 17/989,022

(22) Filed: Nov. 17, 2022

(65) Prior Publication Data

US 2023/0072723 A1 Mar. 9, 2023

Related U.S. Application Data

(62) Division of application No. 16/798,351, filed on Feb. 22, 2020, now Pat. No. 11,528,806.

(51) Int. Cl.
*H05K 3/30* (2006.01)
*H05K 1/18* (2006.01)
(Continued)

(52) U.S. Cl.
CPC ......... *H05K 1/189* (2013.01); *H01F 27/2804* (2013.01); *H01F 27/30* (2013.01); *H01F 41/041* (2013.01); *H01F 41/071* (2016.01); *H05K 1/028* (2013.01); *H05K 1/0228* (2013.01); *H05K 1/118* (2013.01); *H05K 1/147* (2013.01);
(Continued)

(58) Field of Classification Search
CPC ...... H05K 1/0228; H05K 1/028; H05K 1/118; H05K 1/147; H05K 1/165; H05K 1/189; H05K 2201/052; H05K 2201/056; H05K 2201/09227; H05K 2201/09272; H01F 41/041; H01F 41/071; H01F 2017/006; H01F 27/30
See application file for complete search history.

(56) References Cited

U.S. PATENT DOCUMENTS 6,534,723 B1  3/2003 Asai et al.
9,226,688 B2  1/2016 Jacobsen et al.
(Continued)

FOREIGN PATENT DOCUMENTS

EP  2868169 A1  5/2015
KR  101595529 B1  2/2016

OTHER PUBLICATIONS

PCT/US2021/015976, International Search Report, dated May 25, 2021.
(Continued)

*Primary Examiner* — Paul D Kim
(74) *Attorney, Agent, or Firm* — Huse IP Law; Charles C. Huse (57) ABSTRACT

A method of fabricating an electromagnet includes obtaining a first flexible PCB that includes one or more first conductive coiled traces and obtaining a second flexible PCB that includes one or more second conductive coiled traces. The first flexible PCB is bent into a shape having at least one curve or corner. With the first flexible PCB having been bent into the shape, the second flexible PCB is then bent into the shape: the second flexible PCB is positioned adjacent to the first flexible PCB to conform with the first flexible PCB. The second flexible PCB may substantially surround the first flexible PCB. An electrostatic deflector may be disposed concentrically with the first and second flexible PCBs.

15 Claims, 7 Drawing Sheets

(51) Int. Cl.
  *H05K 1/11*   (2006.01)
  *H05K 1/02*   (2006.01)
  *H05K 1/14*   (2006.01)
  *H01F 27/30*   (2006.01)
  *H01F 41/04*   (2006.01)
  *H01F 41/071*   (2016.01)
  *H01F 27/28*   (2006.01)
  *H01F 17/00*   (2006.01)

(52) U.S. Cl.
  CPC ............... *H01F 2017/006* (2013.01); *H05K 2201/09227* (2013.01); *H05K 2201/09272* (2013.01)

(56) References Cited

U.S. PATENT DOCUMENTS

| | | |
|---|---|---|
| 9,721,714 B1 | 8/2017 | Sun et al. |
| 9,899,901 B2 * | 2/2018 | Ikeda ............... H02K 15/04 |
| 2016/0013665 A1 | 1/2016 | Lim et al. |
| 2016/0141097 A1 | 5/2016 | Oo et al. |
| 2019/0254560 A1 * | 8/2019 | Seter ............... A61B 5/062 |

OTHER PUBLICATIONS

PCT/US2021/015976, Written Opinion of the International Searching Authority, dated May 25, 2021.

* cited by examiner

ELECTROMAGNET COILS MADE FROM FLEXIBLE CIRCUITS

RELATED APPLICATION

This application is a divisional of U.S. patent application Ser. No. 16/798,351, filed on Feb. 22, 2020, now U.S. Pat. No. 11,528,806, which is incorporated by reference in its entirety for all purposes.

TECHNICAL FIELD

This disclosure relates to magnetic coils, and more specifically to electromagnetic coils made using flexible printed circuit boards (PCBs).

BACKGROUND

Electromagnets are traditionally formed by manually winding a wire in a prescribed shape with a specified number of turns, thus forming a magnetic coil. Such manual winding results in imprecise and non-repeatable wire placement. This imprecision and non-repeatability complicate calibration of the system in which the magnetic coil is used. Manual winding also is limited in its ability to shape the coil in the specified geometry. For example, sharp corners cannot be achieved because the turning radius is limited. Furthermore, the process of manual winding and of connecting the resulting magnetic coil to a power source (e.g., a current supply) is prone to human error.

Electromagnets have also been fabricated using single-layer flexible printed circuit boards (PCBs), with the coil formed by a conductive trace on the PCB. The number of turns of the coil that can be achieved in a single layer is limited, however, thus limiting the strength of the electromagnet. Adding additional layers to the PCB is not practical because it increases the rigidity of the PCB, which prevents the PCB from being bent into the desired shape (i.e., the specified geometry) for the electromagnet.

An example of an application for such electromagnets is in Wien filters, which use perpendicular electric and magnetic fields to perform velocity filtering for charged particles (e.g., electrons). Wien filters are used in electron microscopes.

SUMMARY

The problems described above are solved by using multiple flexible PCBs to form an electromagnet.

In some embodiments, a method includes obtaining a first flexible PCB that includes one or more first conductive coiled traces and obtaining a second flexible PCB that includes one or more second conductive coiled traces. The first flexible PCB is bent into a shape having at least one curve or corner. With the first flexible PCB having been bent into the shape, the second flexible PCB is then bent into the shape: the second flexible PCB is positioned adjacent to the first flexible PCB to conform with the first flexible PCB.

In some embodiments, an electromagnet includes a first flexible PCB with one or more first conductive coiled traces. The first flexible PCB is bent into a shape that has at least one curve or corner. The electromagnet further includes a second flexible PCB that is bent into the shape and has one or more second conductive coiled traces. The second flexible PCB is adjacent to and conforms with the first flexible PCB.

BRIEF DESCRIPTION OF THE DRAWINGS

For a better understanding of the various described implementations, reference should be made to the Detailed Description below, in conjunction with the following drawings.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
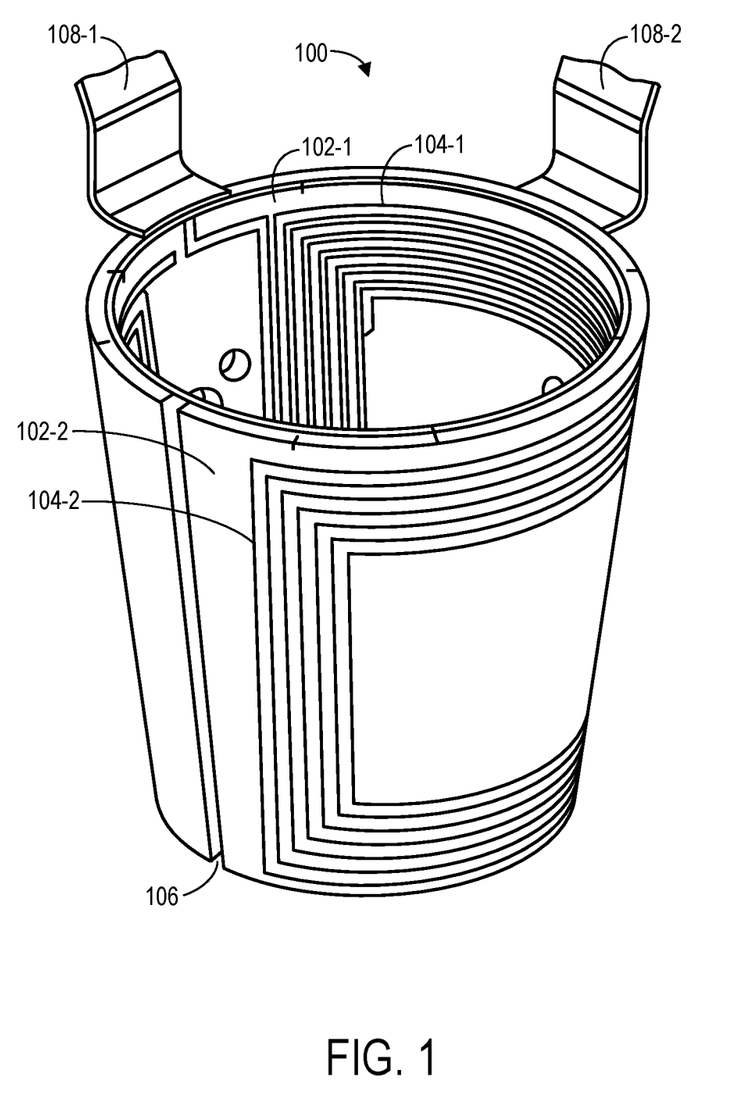
FIG. 1 shows an electromagnet that includes a plurality of flexible printed circuit boards (PCBs) bent into a specified shape, in accordance with some embodiments.

FIG. 1 shows an electromagnet 100 that includes a plurality of flexible printed circuit boards (PCBs) 102 bent into a specified shape, in accordance with some embodiments. The flexible PCBs 102 include a first flexible PCB 102-1 and a second flexible PCB 102-2. Each PCB 102 includes one or more conductive coiled traces 104: The first flexible PCB 102-1 includes one or more conductive coiled traces 104-1 and the second flexible PCB 102-2 includes one or more conductive coiled traces 104-2. The second flexible PCB 102-2 conforms with and substantially surrounds the first flexible PCB 102-1, except for a small gap 106 resulting from the fact that the first and second flexible PCBs 102-1 and 102-2 are the same size, in accordance with some embodiments. In some embodiments, one or more additional flexible PCBs 102, each with one or more respective conductive coiled traces 104, are situated between the first flexible PCB 102-1 and the second flexible PCB 102-2. Adjacent flexible PCBs 102 may be mechanically connected (e.g., adhesively connected).

In the example of FIG. 1, the specified shape into which the flexible PCBs 102 have been bent is frustoconical, with the first flexible PCB 102-1 and the second flexible PCB 102-2 arranged concentrically about a radial axis. Other shapes are possible. For example, the flexible PCBs 102 may be bent into shapes with cylindrical, elliptical, rectangular, or polygonal cross-sections.

Current flowing through the conductive coiled traces 104 produces a magnetic field in the space surrounded by the flexible PCBs 102. The electromagnet 100 includes connectors 108-1 and 108-2 to provide the current to the conductive coiled traces 104. The connector 108-1 connects mechanically to the first flexible PCB 102-1 and includes one or more conductors (e.g., conductive traces) that electrically connect to the one or more conductive coiled traces 104-1. The connector 108-2 connects mechanically to the second flexible PCB 102-2 and includes one or more conductors (e.g., conductive traces) that electrically connect to the one or more conductive coiled traces 104-2. In some embodiments, the connector 108-1 is a flexible PCB that is integrally formed with the flexible PCB 102-1, and the connector 108-2 is a flexible PCB that is integrally formed with the flexible PCB 102-2. The connectors 108-1 and 108-2 are coupled to a power supply, such as a current source (not shown). In some embodiments, the one or more conductive coiled traces 104 on adjacent flexible PCBs 102 are electrically connected through contacts on the surfaces of the flexible PCBs 102. For example, assuming the flexible PCBs 102-1 and 102-2 are adjacent, the one or more conductive coiled traces 104-1 may be electrically connected to the one or more conductive coiled traces 104-2 through one or more contacts (e.g., contacts 202, FIG. 2) on the flexible PCBs 102-1 and 102-2.

Figure 2:
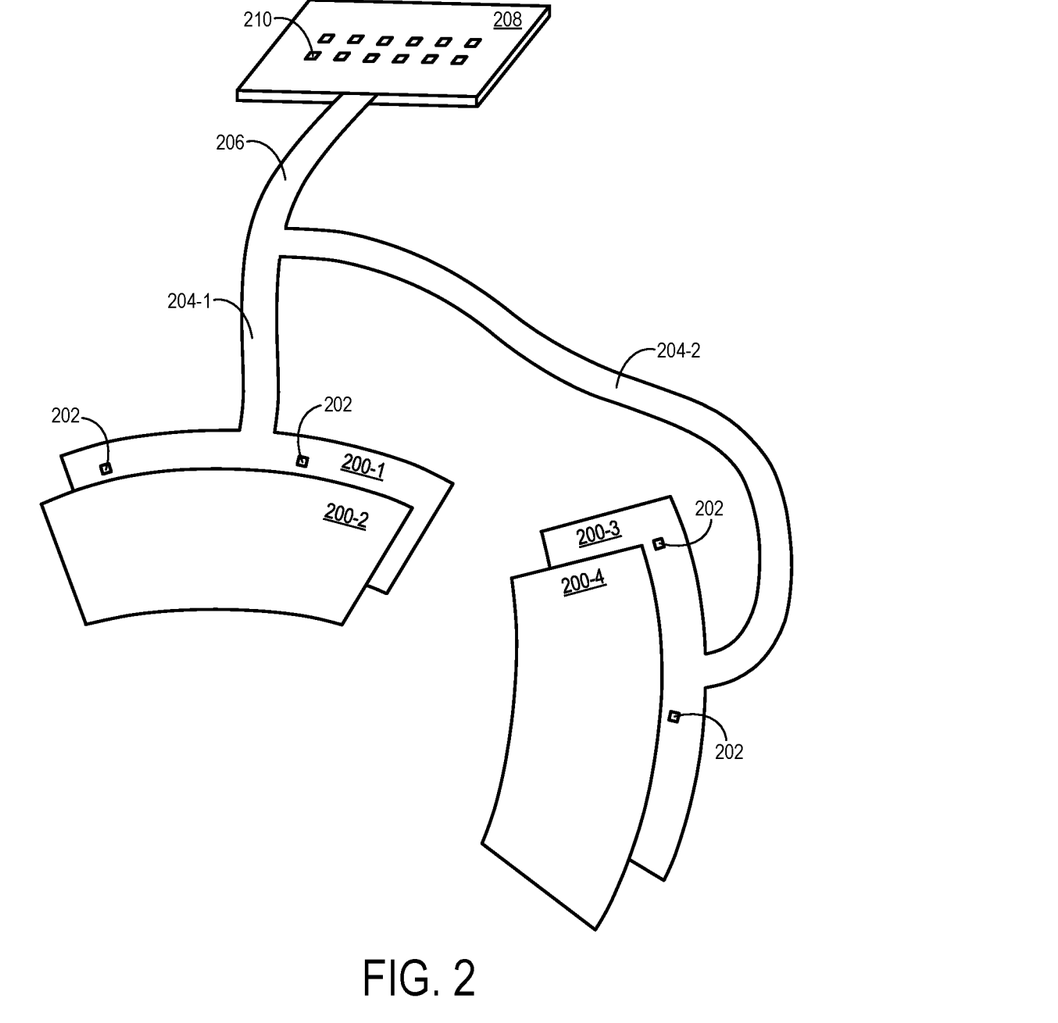
FIG. 2 shows flexible PCBs and an associated connector in accordance with some embodiments.

FIG. 2 shows flexible PCBs 200 and an associated connector 206 in accordance with some embodiments. The flexible PCBs 200 as shown in FIG. 2 have not yet been bent into a specified shape. The flexible PCBs 200, which may be examples of flexible PCBs 102 (FIG. 1), include a first flexible PCB 200-1, a second flexible PCB 200-2, a third flexible PCB 200-3, and a fourth flexible PCB 200-4. Each of the flexible PCBs 200 includes one or more conductive coiled traces (not shown) (e.g., conductive coiled traces 302-1, 302-2, 304-1, and 304-2, FIG. 3A). The first flexible PCB 200-1 includes contacts 202 that can electrically contact similar contacts (not visible) on the second flexible PCB 200-2 to electrically connect the conductive coiled traces on the first and second PCBs 200-1 and 200-2. Similarly, the third flexible PCB 200-3 includes contacts 202 that can electrically contact similar contacts (not visible) on the fourth flexible PCB 200-4 to electrically connect the conductive coiled traces on the third and fourth PCBs 200-3 and 200-4.

The connector 206 includes a first arm 204-1 that mechanically and electrically connects to the first flexible PCB 200-1 and a second arm 204-2 that mechanically and electrically connects to the third flexible PCB 200-3. The first arm 204-1 may be an example of the connector 108-1 and the second arm 204-2 may be an example of the connector 108-2 (or vice-versa). In some embodiments, the connector 206, including the first arm 204-1 and/or the second arm 204-2, are integrally formed with the first flexible PCB 200-1 and/or the third flexible PCB 200-3. The connector 206 mechanically and electrically connects to a contact pad 208 and includes conductors (not shown) (e.g., conductors 312 and 314, FIG. 3A; traces 406-1 and 406-2, FIG. 4) to electrically couple the conductive coiled traces on the flexible PCBs 200-1 through 200-4 with contacts 210 on the contact pad 208. The conductors in the connector 206 may be conductive traces. The contacts 210 can be electrically coupled to a power source (e.g., current supply) and thus allow the conductive coiled traces on the flexible PCBs 200-1 through 200-4 to be electrically coupled to the power source.

In some embodiments, the four flexible PCBs 200-1 through 200-4 may be bent into the same shape and positioned against each other (i.e., adjacently) in a conformal, concentric manner to form a single electromagnet (e.g., the electromagnet 100, FIG. 1). In this example, the conductive coiled traces on the four flexible PCBs 200-1 through 200-4 may be connected in series, such that the current polarity is the same for the conductive coiled traces on all four flexible PCBs 200-1 through 200-4. The additional conductive coiled traces provided by the third and fourth flexible PCBs 200-3 and 200-4 result in a stronger electromagnet than if only two flexible PCBs 200-1 and 200-2 are used.

In some other embodiments, the first and second flexible PCBs 200-1 and 200-2 may be bent into the same shape and positioned against each other (i.e., adjacently) in a conformal, concentric manner to form a first electromagnet (e.g., a first electromagnet 100, FIG. 1). The third and fourth flexible PCBs 200-3 and 200-4 may be bent into the same shape and positioned against each other (i.e., adjacently) in a conformal, concentric manner to form a second electromagnet (e.g., a second electromagnet 100, FIG. 1) distinct from the first electromagnet.

In some embodiments, the conductive coiled traces in the first and second flexible PCBs 200-1 and 200-2 are electrically connected in series, such that the current polarity is the same for the conductive coiled traces on the first and second PCBs 200-1 and 200-2. The first and second flexible PCBs 200-1 and 200-2 thus form an electromagnet. The one or more conductive coiled traces in the third flexible PCB 200-3, however, are not connected in series to the one or more conductive coiled traces in the fourth flexible PCB 200-4. Instead, the one or more conductive coiled traces in the third flexible PCB 200-3 are wired to conduct current with a polarity opposite to the polarity of the current conducted by the one or more conductive coiled traces in the fourth flexible PCB 200-4. This configuration may be achieved by electrically coupling the conductive coiled traces of the third and fourth PCBs 200-3 and 200-4 to respective contacts 210 on the contact pad 208 that provide current of the desired polarities. In this configuration, the magnetic field produced by the one or more conductive coiled traces in the fourth flexible PCB 200-4 would be opposite to, and thus cancel out, the magnetic field produced by the one or more conductive coiled traces in the third flexible PCB 200-3. The resulting combination of the third and fourth PCBs 200-3 and 200-4, as positioned against each other (i.e., adjacently) in a conformal, concentric manner, would produce a heater that can be used to offset variations in heat for the combination of the first and second PCBs 200-1 and 200-2 (as positioned against each other in a conformal, concentric manner). When the current provided to the first and second PCBs 200-1 and 200-2 is reduced (or increased), the current provided to the third and fourth PCBs 200-3 and 200-4 is increased (or decreased) by a corresponding amount, to offset the change in heating, thus resulting in overall constant heating. Constant heating is desirable to maintain calibration and ensure consistent performance of the system.

Figure 3A:
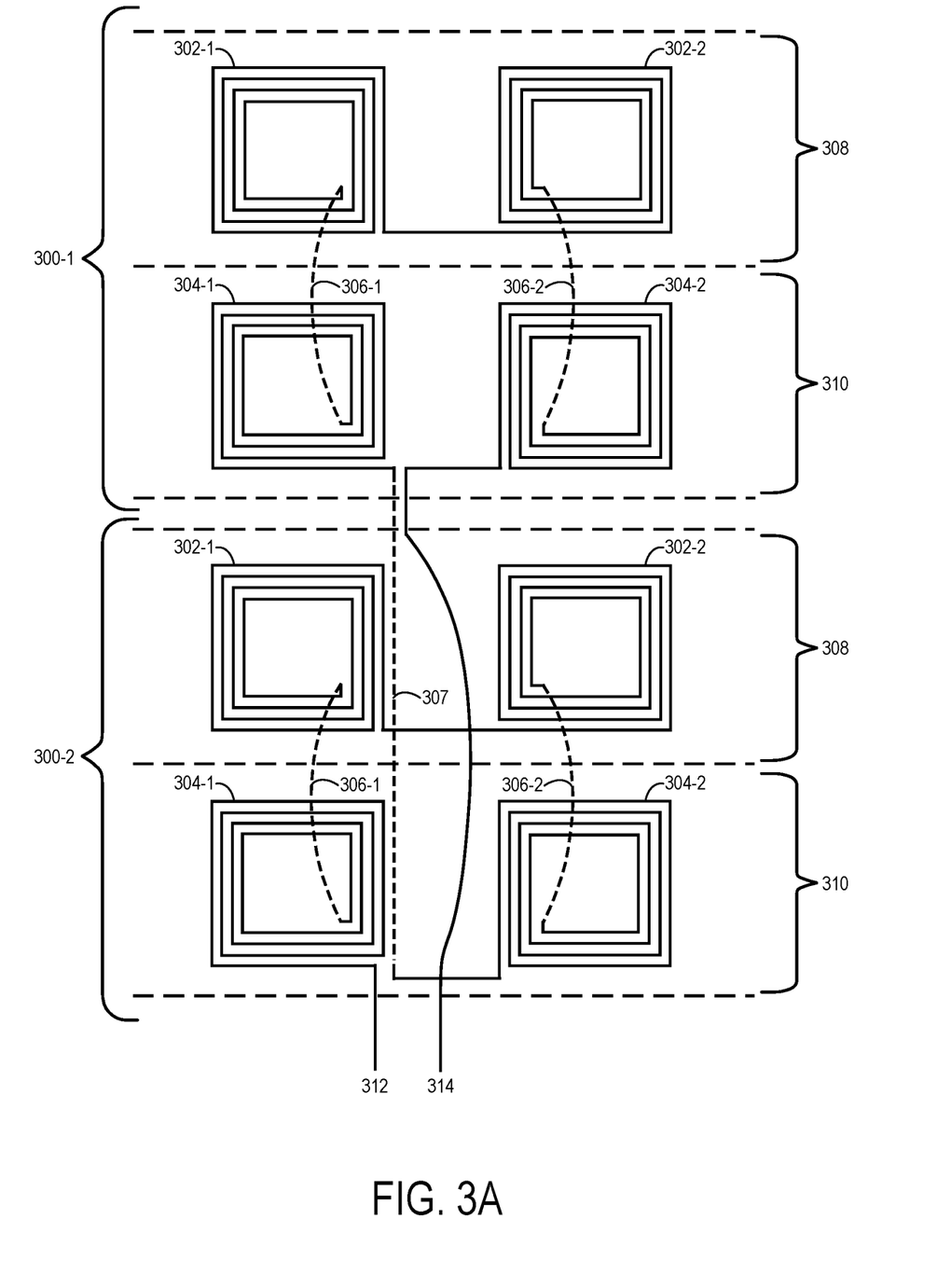
FIG. 3A shows conductive coiled traces on two flexible PCBs, along with the electrical connections between the conductive coiled traces, in accordance with some embodiments.

FIG. 3A shows conductive coiled traces on two flexible PCBs 300-1 and 300-2, along with the electrical connections between the conductive coiled traces, in accordance with some embodiments. The flexible PCBs 300-1 and 300-2 may be examples of the flexible PCBs 200-1 and 200-2 (FIG. 2), the flexible PCBs 200-3 and 200-4 (FIG. 2), and/or the flexible PCBs 102-1 and 102-2 (FIG. 1). Each of the flexible PCBs 300-1 and 300-2 has a pair of conductive coiled traces 302-1 and 302-2 on a first side 308 and a pair of conductive coiled traces 304-1 and 304-2 on a second side 310. The first side 308 is separated from the second side 310 by an insulating (e.g., polyimide) layer (e.g., insulating layer 322, FIG. 3B). The conductive coiled traces 302-1 and 302-2 on the first side 308 are covered by a first insulating (e.g., polyimide) cover layer (e.g., cover layer 320, FIG. 3B). Likewise, the conductive coiled traces 304-1 and 304-2 on the second side 310 are covered by a second insulating (e.g., polyimide) cover layer (e.g., cover layer 324, FIG. 3B).

The conductive coiled traces 302 and 304 are rectangular spirals each with a specified number of turns. Successive segments of the rectangular spirals are thus perpendicular to each other and meet at substantially right angles (although there may be some degree of curvature to the corners in some embodiments). The number of turns shown in FIG. 3A is four, but in general the number of turns may vary. For example, the number of turns may be five, six, or more. Furthermore, each of the flexible PCBs 300-1 and 300-2 may have only a single conductive coiled trace 302 on the first side 308 and a single conductive coiled trace 304 on the second side 310, or may have more than two conductive coiled traces 302 on the first side 308 and more than two conductive coiled traces 304 on the second side 310. In some embodiments, the conductive coiled traces 302 and 304 are copper.

The conductive coiled trace 302-1 is electrically connected to the conductive coiled trace 302-2: both are formed by a single long trace, as shown. The inner end of the conductive coiled trace 302-1 is electrically connected to the inner end of the conductive coiled trace 304-1 through a via 306-1. Similarly, the inner end of the conductive coiled trace 302-2 is electrically connected to the inner end of the conductive coiled trace 304-2 through a via 306-2. In some embodiments, the vias 306-1 and 306-2 are copper. The outer end of the conductive coiled trace 304-1 of the flexible PCB 300-1 is electrically connected to the outer end of the conductive coiled trace 304-2 of the flexible PCB 300-2 through contacts 307 (e.g., contacts 202, FIG. 2). The outer end of the conductive coiled trace 304-1 of the flexible PCB 300-2 is electrically connected to a conductor 312 (e.g., a conductive trace in a connector 206, FIG. 2, and/or a connector 108, FIG. 1; a conductive trace 406, FIG. 4). The outer end of the conductive coiled trace 304-2 of the flexible PCB 300-1 is electrically connected to a conductor 314 (e.g., a conductive trace in a connector 206, FIG. 2, and/or a connector 108, FIG. 1). The conductors 312 and 314 provided current to the conductive coiled traces 302 and 304, which are connected in series between the conductors 312 and 314. FIG. 3A shows one example of a series connection for the conductive coiled traces 302 and 304; others are possible.

Figure 3B:
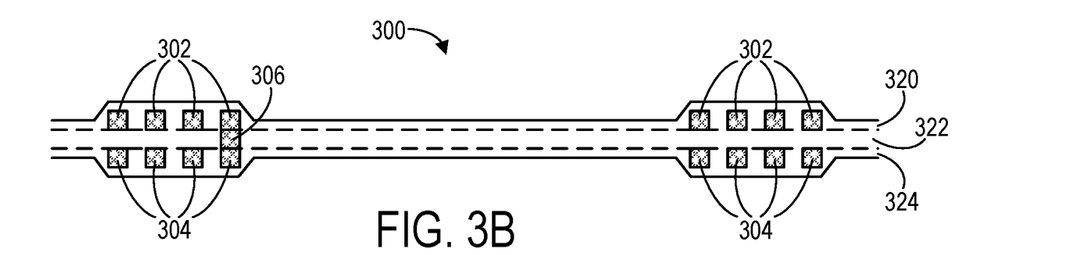
FIG. 3B shows a cross-section of a portion of a flexible PCB in FIG. 3A, in accordance with some embodiments.

FIG. 3B shows a cross-section of a portion of a flexible PCB 300 (e.g., flexible PCB 300-1 or 300-2, FIG. 3A) in accordance with some embodiments. A conductive coiled trace 302 (e.g., conductive coiled trace 302-1 or 302-2, FIG. 3A) is situated on a first side of the PCB 300. A conductive coiled trace 304 (e.g., conductive coiled trace 304-1 or 304-2, FIG. 3A) is situated on a second side of the PCB 300. An insulating (e.g., polyimide) layer 322 in the middle of the flexible PCB 300 separates the conductive coiled trace 302 from the conductive coiled trace 304. A via 306 electrically connects the conductive coiled trace 302 with the conductive coiled trace 304. In some embodiments, the conductive coiled traces 302 and 304 and via 306 are copper. An insulating (e.g., polyimide) cover layer 320 covers the conductive coiled trace 302 on the first side, and an insulating (e.g., polyimide) cover layer 324 covers the conductive coiled trace 304 on the first side. The flexible PCB 300 has one or more contacts (not visible) (e.g., contacts 202, FIG. 2) for electrically connecting the conductive coiled traces 302 and 304 with conductive coiled traces on other flexible PCBs (e.g., to another instance of the flexible PCB 300). The flexible PCB 300 also has one or more contacts (not visible) for electrically connecting the conductive coiled traces 302 and 304 with conductors in a connector (e.g., connector 206, FIG. 2; connector 108, FIG. 1; connector 404, FIG. 4).

Figure 4:
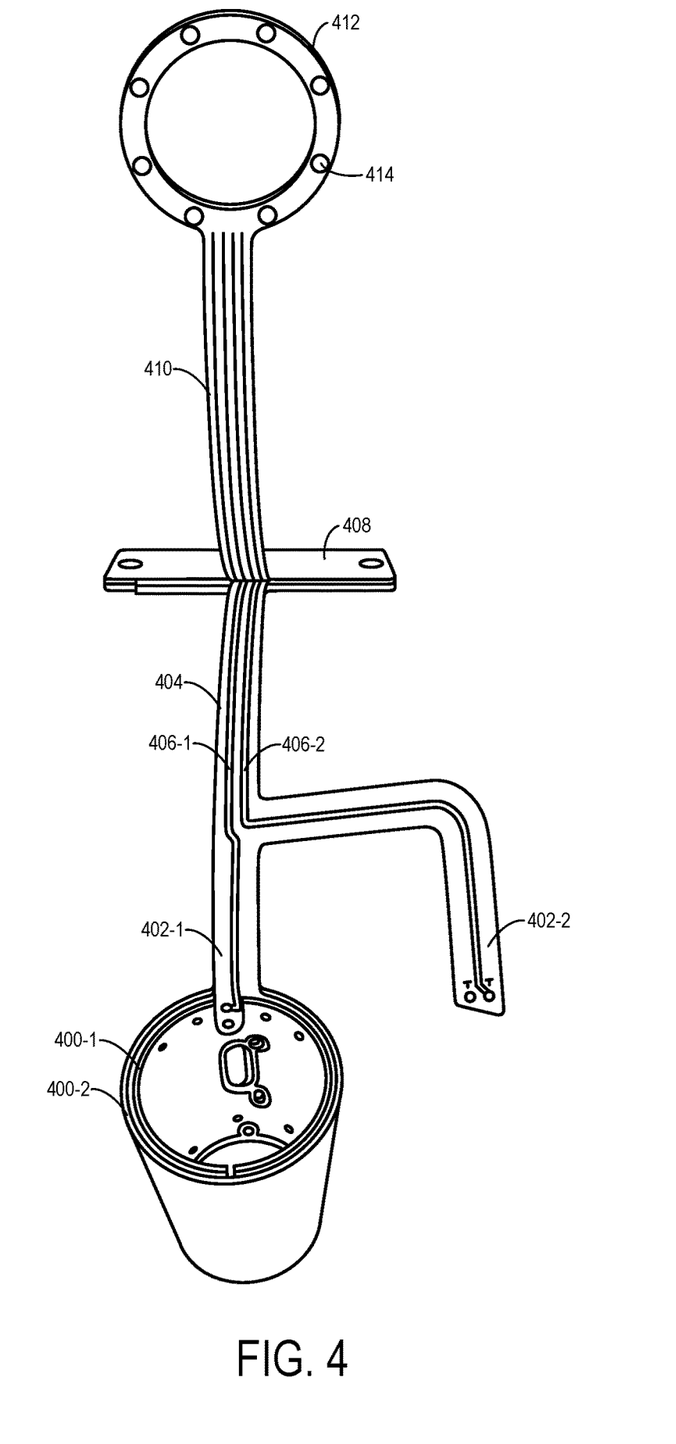
FIG. 4 shows a system that includes a pair of flexible PCBs bent into a specified shape in a conformal, concentric manner and also includes a connection ring for an electrostatic deflector, in accordance with some embodiments.

FIG. 4 shows a system in which a pair of flexible PCBs 400-1 and 400-2 are bent into a specified shape in a conformal, concentric manner, such that the flexible PCB 400-2 substantially surrounds the flexible PCB 400-1, in accordance with some embodiments. The flexible PCBs 400-1 and 400-2 each include one or more conductive coiled traces (not shown). For example, the flexible PCBs 400-1 and 400-2 may be implementations of the flexible PCBs 102-1 and 102-2 (FIG. 1), 202-1 and 202-2 (FIG. 2), 202-3 and 202-4 (FIG. 2), and/or 300-1 and 300-2 (FIG. 3A). The one or more conductive coiled traces of the flexible PCBs 400-1 and 400-2 are electrically connected to a contact pad 408 (e.g., contact pad 208, FIG. 2) through a first arm 402-1 of a connector 404. Conductive traces including a trace 406-1 (e.g., and another trace on the non-visible side of the first arm 402-1) may complete the circuit between the contact pad 408 and the conductive coiled traces of the flexible PCBs 400-1 and 400-2. The connector includes a second arm 402-2 (e.g., arm 204-2, FIG. 2) with one or more conductive traces including a trace 406-2 (e.g., and another trace on the non-visible side of the second arm 402-2) for electrically connecting to conductive coiled traces on a second pair of flexible PCBs (not shown), as described for example with respect to FIG. 2, or alternatively for electrically connecting to one or more conductive coiled traces on the flexible PCB 400-2.

Figure 5:
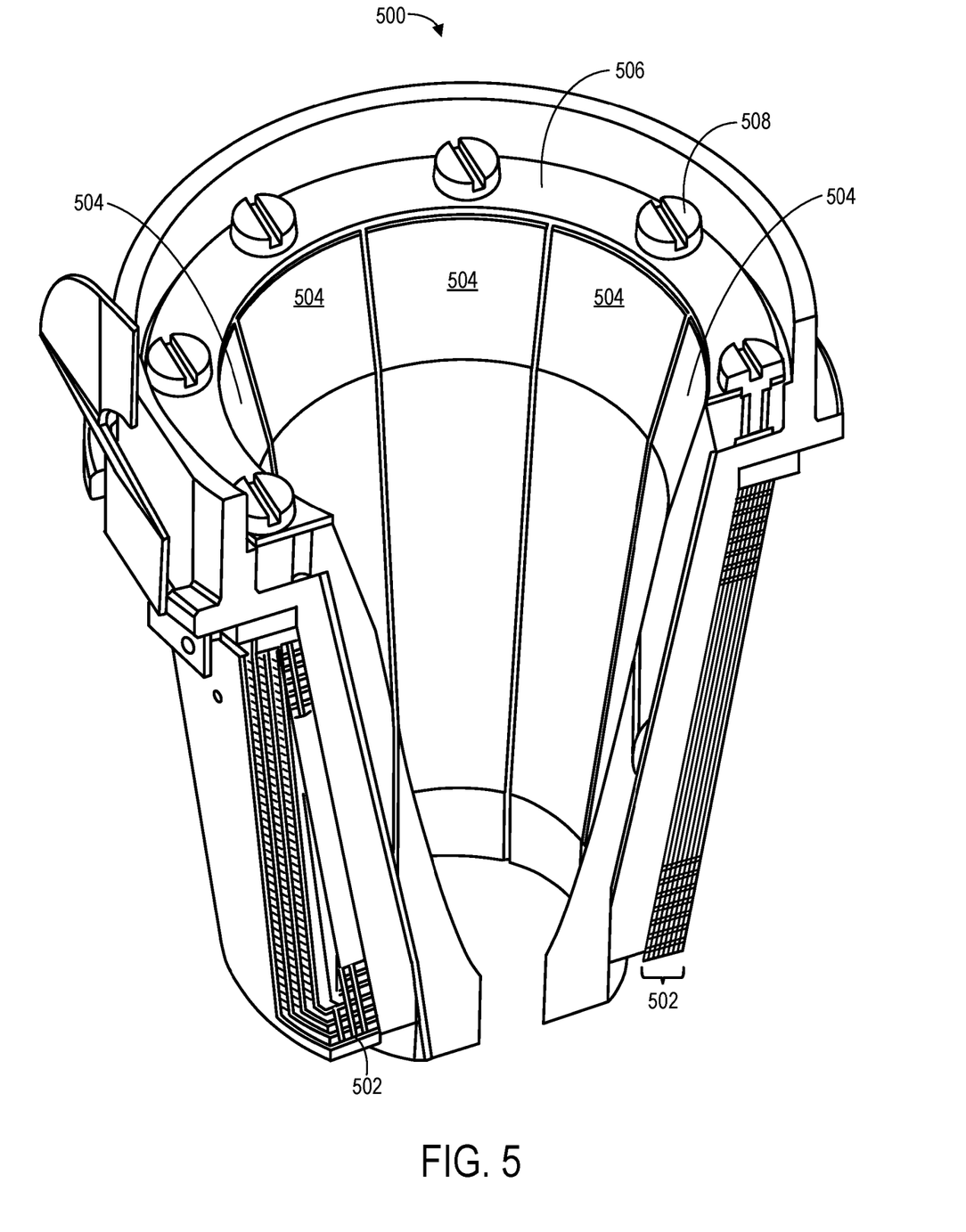
FIG. 5 shows a cross-section and partial perspective view of an assembly with an electromagnet and an electrostatic deflector arranged concentrically, in accordance with some embodiments.

The system of FIG. 4 also includes a connection ring 412 for an electrostatic deflector (e.g., as shown in FIG. 5), in accordance with some embodiments. The connection ring 412 includes contacts 414 that provide electrical connections to respective poles (e.g., poles 504, FIG. 5) of the electrostatic connector. The connection ring 412 is electrically connected to the contact pad 408 through a connector 410 (e.g., through conductive traces in the connector 410). The contact pad 408 may be coupled to a power source (e.g., a voltage supply) for biasing the poles of the electrostatic deflector.

FIG. 5 shows a cross-section and partial perspective view of an assembly 500 with an electromagnet 502 and an electrostatic deflector arranged concentrically, in accordance with some embodiments. The assembly 500 may be a Wien filter (e.g., for an electron microscope). The electromagnet 502 includes a plurality of flexible PCBs with conductive coiled traces (e.g., flexible PCBs 102-1 and 102-2, FIG. 1; 200-1, 200-2, 200-3, and/or 200-4, FIGS. 2; 300-1 and 300-2, FIG. 3A; 400-1 and 400-2, FIG. 4). The plurality of flexible PCBs is arranged in a conformal, concentric manner with respective flexible PCBs adjacent to each other. The electrostatic deflector includes a plurality of poles 504 (e.g., eight poles 504, such that the electrostatic deflector has an octopole configuration), each of which has a conductive surface. The poles 504 are disposed radially within the opening surrounded by the electromagnet 502. By biasing the poles 504, an electric field is generated in the opening surrounded by the electromagnet 502. The poles 504 are biased at the same time current is provided to the plurality of flexible PCBs, resulting in simultaneous electric and magnetic fields in the opening. The simultaneous electric and magnetic fields may be perpendicular. A connection ring 506 (e.g., connection ring 412, FIG. 4) provides electrical contacts (not visible) (e.g., contacts 414, FIG. 4) for the poles 504. Screws 508, or another suitable connection mechanism, holds the connection ring 506 in place and forces respective electrical contacts into contact with the poles 504.

Figure 6A:
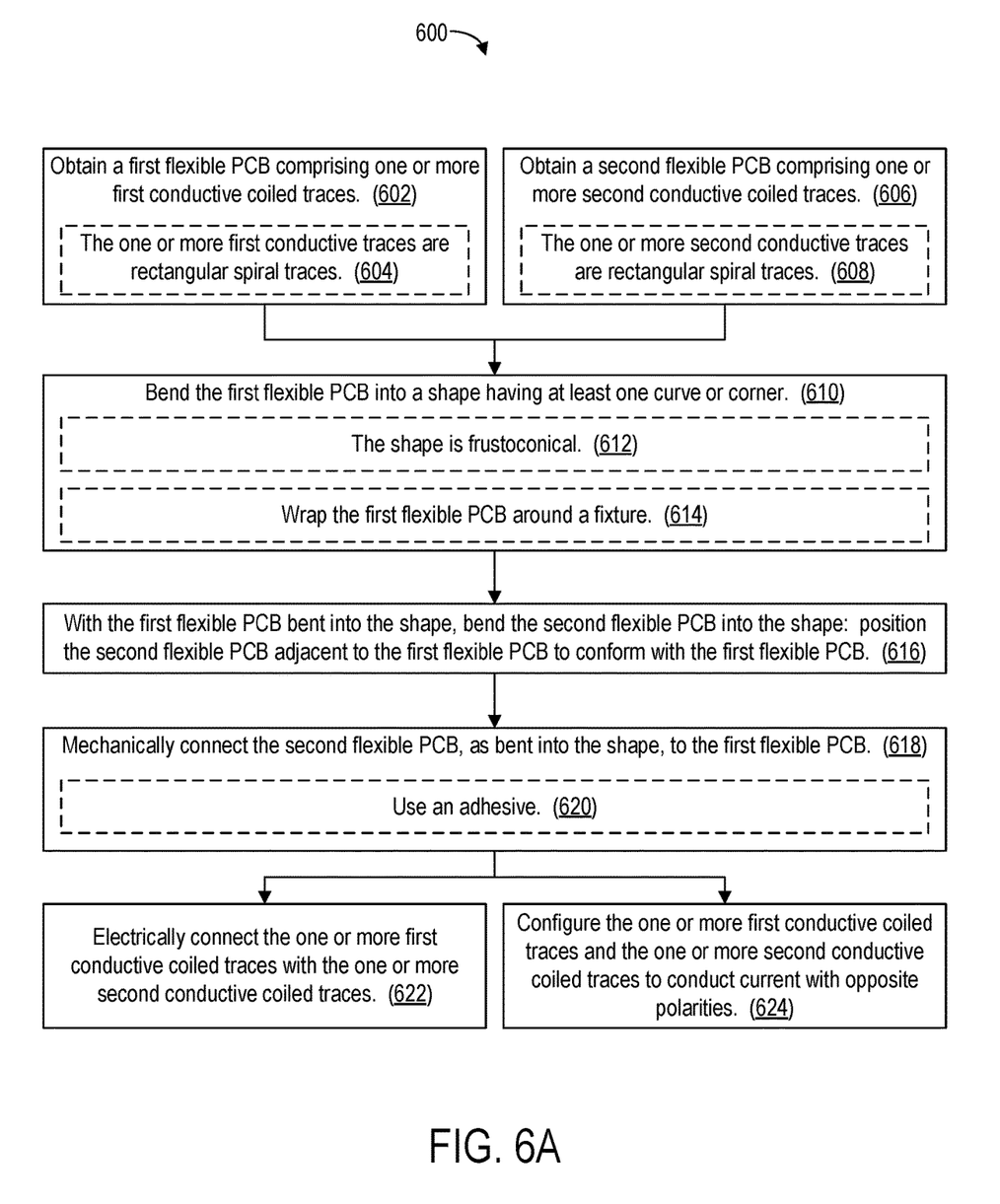
FIG. 6A is a flowchart showing a method of fabricating an electromagnet using multiple flexible PCBs, in accordance with some embodiments.

FIG. 6A is a flowchart showing a method 600 of fabricating an electromagnet (e.g., electromagnet 100, FIG. 1; electromagnet 502, FIG. 5) (or in some embodiments, a device with zero magnetic field) using multiple flexible PCBs, in accordance with some embodiments. In the method 600, a first flexible PCB (e.g., flexible PCB 102-1, FIG. 1; 200-1 or 200-3, FIG. 2; 300-1, FIG. 3A; 400-1, FIG. 4) is obtained (602) that includes one or more first conductive coiled traces (e.g., conductive coiled trace 104-1, FIG. 1; conductive coiled traces 302-1, 302-2, 304-1, and 304-2, FIG. 3A). In some embodiments, the one or more first conductive traces are (604) rectangular spiral traces. A second flexible PCB (e.g., flexible PCB 102-2, FIG. 1; 200-2 or 200-4, FIG. 2; 300-2, FIG. 3A; 400-2, FIG. 4) is also obtained (606) that includes one or more second conductive coiled traces (e.g., conductive coiled trace 104-2, FIG. 1; conductive coiled traces 302-1, 302-2, 304-1, and 304-2, FIG. 3A). In some embodiments, the one or more second conductive traces are (608) rectangular spiral traces.

The first flexible PCB is bent (610) into a shape having at least one curve or corner. In some embodiments, the shape is (612) frustoconical. Other examples of the shape include, without limitation, shapes with cylindrical, elliptical, rectangular, or polygonal cross-sections. In some embodiments, the first flexible PCB is bent by wrapping (614) it around a fixture that has the shape. The fixture is subsequently removed (e.g., after all flexible PCBs have been bent into the shape).

With the first flexible PCB having been bent into the shape, the second flexible PCB is then bent (616) into the shape: the second flexible PCB is positioned adjacent to the first flexible PCB to conform with the first flexible PCB (e.g., in a concentric manner). In some embodiments, the second flexible PCB, as bent into the shape, is mechanically connected (618) to the first flexible PCB. For example, an adhesive is used (620) to attach the second flexible PCB to the first second flexible PCB.

In some embodiments, the one or more first conductive coiled traces are electrically connected (622) with the one or more second conductive coiled traces (e.g., through contacts 202, FIG. 2; through contacts 307, FIG. 3A), in series. The first and second flexible PCBs, as arranged in accordance with the method 600, thus form an electromagnet.

In some other embodiments, the one or more second conductive coiled traces are configured (624) to conduct current with the opposite polarity as the one or more first conductive coiled traces (i.e., the one or more first conductive coiled traces conduct current with a first polarity and the one or more second conductive coiled traces conduct current with a second polarity opposite to the first polarity). The magnetic field produced by the first flexible PCB thus offsets the magnetic field produced by the second flexible PCB, resulting in a zero-magnetic-field device that functions as a heater.

Figure 6B:
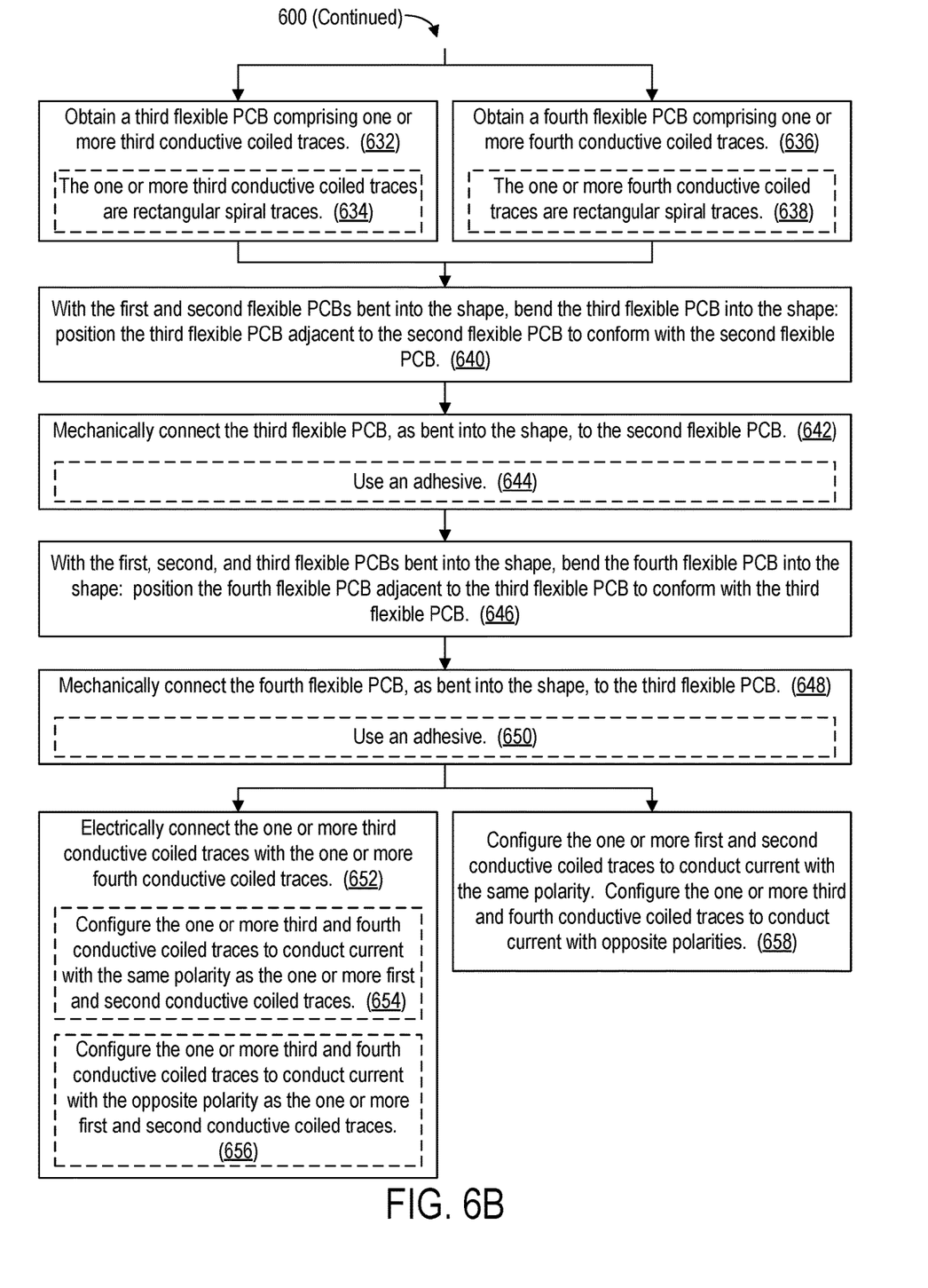
FIG. 6B is a flowchart showing an optional continuation of the method of FIG. 6A in accordance with some embodiments.

FIG. 6B is a flowchart showing an optional continuation of the method 600 in accordance with some embodiments. In this continuation of the method 600, a third flexible PCB (e.g., flexible PCB 200-3, FIG. 2; an instance of PCB 300-1, FIG. 3A) is obtained (632) that includes one or more third conductive coiled traces (e.g., conductive coiled traces 302-1, 302-2, 304-1, and 304-2, FIG. 3A). In some embodiments, the one or more third conductive coiled traces are (634) rectangular spiral traces. A fourth flexible PCB (e.g., flexible PCB 200-4, FIG. 2; an instance of PCB 300-2, FIG. 3A) is also obtained (636) that includes one or more fourth conductive coiled traces (e.g., conductive coiled traces 302-1, 302-2, 304-1, and 304-2, FIG. 3A). In some embodiments, the one or more fourth conductive coiled traces are (638) rectangular spiral traces.

With the first and second flexible PCBs having been bent into the shape, the third flexible PCB is then bent (640) into the shape: the third flexible PCB is positioned adjacent to the second flexible PCB to conform with the second flexible PCB (e.g., in a concentric manner). In some embodiments, the third flexible PCB, as bent into the shape, is mechanically connected (642) to the second flexible PCB. For example, an adhesive is used (644) to attach the third flexible PCB to the second flexible PCB.

With the first, second, and third flexible PCBs having been bent into the shape, the fourth flexible PCB is then bent (646) into the shape: the fourth flexible PCB is positioned adjacent to the third flexible PCB to conform with the third flexible PCB (e.g., in a concentric manner). In some embodiments, the fourth flexible PCB, as bent into the shape, is mechanically connected (648) to the third flexible PCB. For example, an adhesive is used (650) to attach the fourth flexible PCB to the third flexible PCB.

In some embodiments, the one or more third conductive coiled traces are electrically connected (652) with the one or more fourth conductive coiled traces (e.g., through contacts 202, FIG. 2; through contacts 307, FIG. 3A). For example, the one or more third and fourth conductive coiled traces are configured (654) to conduct current with the same polarity as the one or more first and second conductive coiled traces (e.g., the one or more first, second, third, and fourth conductive coils are connected in series). The four flexible PCBs, as arranged in accordance with the method 600, thus form an electromagnet. In another example, the one or more third and fourth conductive coiled traces are configured (656) to conduct current with the opposite polarity as the one or more first and second conductive coiled traces (i.e., the one or more first and second conductive coiled traces conduct current with a first polarity and the one or more third and fourth conductive coiled traces conduct current with a second polarity opposite to the first polarity). The magnetic field produced by the first and second flexible PCBs thus offsets the magnetic field produced by the third and fourth flexible PCBs, resulting in a zero-magnetic-field device that functions as a heater.

In still some other embodiments, the one or more first and second conductive coiled traces are configured (658) to conduct current with the same polarity (e.g., are connected in series), such that the first and second flexible PCBs, as arranged in accordance with the method 600, form an electromagnet. The one or more third conductive coiled traces, however, are configured (658) to conduct current with an opposite polarity as the one or more fourth conductive coiled traces (i.e., the one or more third conductive coiled traces conduct current with a first polarity and the one or more fourth conductive coiled traces conduct current with a second polarity opposite to the first polarity). The third and fourth flexible PCBs, as arranged in accordance with the method 600, thus form a zero-magnetic-field device that functions as a heater. This heater may offset changes in heating by the electromagnet formed by the first and second flexible PCBs.

The method 600 can include more or fewer operations. The order of non-order-dependent operations may be changed and/or two or more operations may be combined into a single operation. For example, steps 632 and 636 may be performed at the same time as steps 602 and 606, before any other steps are performed. In another example, steps in which a respective flexible PCB is bent, mechanically connected to another PCB, and/or electrically connected to another PCB may be combined into a single step.

The method 600 and the flexible PCBs arranged as disclosed herein allow multiple layers of conductive coils to be stacked in an electromagnet, resulting in a strong magnetic field, while still achieving the desired shape for the electromagnetic. The magnetic coils (i.e., the conductive coiled traces) may have sharp corners or tight turning radii. Such electromagnets can be fabricated reproducibly with little error.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A method, comprising:
   obtaining a first flexible printed circuit board (PCB) comprising one or more first conductive coiled traces;
   obtaining a second flexible PCB comprising one or more second conductive coiled traces;
   bending the first flexible PCB into a shape having at least one curve or corner; and
   with the first flexible PCB bent into the shape, bending the second flexible PCB into the shape, comprising positioning the second flexible PCB adjacent to the first flexible PCB to conform with the first flexible PCB and to substantially surround the first flexible PCB.

2. The method of claim 1, further comprising electrically connecting the one or more first conductive coiled traces with the one or more second conductive coiled traces.

3. The method of claim 1, wherein the shape is frusto-conical.

4. The method of claim 1, wherein the one or more first conductive coiled traces and the one or more second conductive coiled traces are rectangular spiral traces.

5. The method of claim 1, wherein:
   bending the first flexible PCB comprises wrapping the first flexible PCB around a fixture; and
   the method further comprises, after wrapping the first flexible PCB around the fixture, removing the fixture.

6. The method of claim 1, further comprising mechanically connecting the second flexible PCB, as bent into the shape, to the first flexible PCB using an adhesive.

7. The method of claim 1, wherein:
   the one or more first conductive coiled traces comprise a first conductive coiled trace on a first side of the first flexible PCB and a second conductive coiled trace on a second side of the first flexible PCB, wherein the first flexible PCB comprises an insulating layer separating the first side from the second side;
   the first flexible PCB further comprises a via through the insulating layer electrically connecting the first conductive coiled trace with the second conductive coiled trace;
   the one or more second conductive coiled traces comprise a third conductive coiled trace on a first side of the second flexible PCB and a fourth conductive coiled trace on a second side of the second flexible PCB, wherein the second flexible PCB comprises an insulating layer separating the first side from the second side; and
   the second flexible PCB further comprises a via through the insulating layer electrically connecting the third conductive coiled trace with the fourth conductive coiled trace.

8. The method of claim 1, further comprising:
   obtaining a third flexible PCB comprising one or more third conductive coiled traces;
   obtaining a fourth flexible PCB comprising one or more fourth conductive coiled traces;
   with the first and second flexible PCBs bent into the shape, bending the third flexible PCB into the shape, comprising positioning the third flexible PCB adjacent to the second flexible PCB to conform with the second flexible PCB; and
   with the first, second, and third flexible PCBs bent into the shape, bending the fourth flexible PCB into the shape, comprising positioning the fourth flexible PCB adjacent to the third flexible PCB to conform with the third flexible PCB.

9. The method of claim 8, further comprising:
   electrically connecting the one or more first conductive coiled traces with the one or more second conductive coiled traces; and
   electrically connecting the one or more third conductive coiled traces with the one or more fourth conductive coiled traces.

10. The method of claim 8, further comprising configuring the one or more third conductive coiled traces and the one or more fourth conductive coiled traces to conduct current with the same polarity as the one or more first conductive coiled traces and the one or more second conductive coiled traces.

11. The method of claim 8, further comprising:
    configuring the one or more first conductive coiled traces and the one or more second conductive coiled traces to conduct current with a first polarity; and
    configuring the one or more third conductive coiled traces and the one or more fourth conductive coiled traces to conduct current with a second polarity opposite to the first polarity.

12. The method of claim 8, further comprising:
    configuring the one or more first conductive coiled traces and the one or more second conductive coiled traces to conduct current with the same polarity; and
    configuring the one or more third conductive coiled traces and the one or more fourth conductive coiled traces to conduct current with opposite polarities.

13. The method of claim 1, further comprising:
    configuring the one or more first conductive coiled traces to conduct current with a first polarity; and configuring the one or more second conductive coiled traces to conduct current with a second polarity opposite to the first polarity.

14. The method of claim 1, further comprising disposing an electrostatic deflector concentrically with the first and second flexible PCBs.

15. A method, comprising:
- obtaining a first flexible printed circuit board (PCB) comprising one or more first conductive coiled traces;
- obtaining a second flexible PCB comprising one or more second conductive coiled traces;
- bending the first flexible PCB into a shape having at least one curve or corner;
- with the first flexible PCB bent into the shape, bending the second flexible PCB into the shape, comprising positioning the second flexible PCB adjacent to the first flexible PCB to conform with the first flexible PCB; and
- disposing an electrostatic deflector concentrically with the first and second flexible PCBs.

* * * * *